United States Patent
Duncan et al.

(10) Patent No.: US 6,534,977 B1
(45) Date of Patent: Mar. 18, 2003

(54) METHODS AND APPARATUS FOR OPTICALLY MEASURING POLARIZATION ROTATION OF OPTICAL WAVEFRONTS USING RARE EARTH IRON GARNETS

(76) Inventors: Paul Duncan, 8544 Electric Ave., Vienna, VA (US) 22182; Carvel E. Holton, 945 Shilo Way, Blacksburg, VA (US) 24060; Richard O. Claus, 911 Allendale Ct., Blacksburg, VA (US) 24060

(*) Notice: Subject to any disclaimer, the term of this patent is extended or adjusted under 35 U.S.C. 154(b) by 0 days.

(21) Appl. No.: 09/421,399

(22) Filed: Oct. 21, 1999

Related U.S. Application Data
(60) Provisional application No. 60/105,126, filed on Oct. 21, 1998.

(51) Int. Cl.[7] ................................................ G01R 33/02
(52) U.S. Cl. ...................... 324/244.1; 324/260; 359/280
(58) Field of Search ................................ 324/244.1, 96, 324/750, 752; 250/227, 225; 359/280, 281, 282, 283

(56) References Cited

U.S. PATENT DOCUMENTS

| | | |
|---|---|---|
| 3,784,281 A | 1/1974 | Kuse |
| 4,563,639 A | 1/1986 | Langeac |
| 4,644,153 A | 2/1987 | Ida |
| 4,698,497 A | 10/1987 | Miller et al. |
| 4,755,665 A | 7/1988 | Ulmer, Jr. et al. |
| 4,810,065 A * | 3/1989 | Valette et al. ................ 350/355 |
| 4,932,760 A | 6/1990 | Arii et al. |
| 4,933,629 A | 6/1990 | Kozuka et al. |
| 4,947,035 A | 8/1990 | Zook et al. |
| 4,947,107 A * | 8/1990 | Doerfler et al. ................ 324/96 |
| 4,973,899 A | 11/1990 | Jones et al. |
| 5,008,611 A | 4/1991 | Ulmer, Jr. |
| 5,066,903 A | 11/1991 | Ochi |
| 5,134,362 A | 7/1992 | Ochi |
| 5,278,853 A | 1/1994 | Shirai et al. |
| 5,408,565 A | 4/1995 | Levy et al. |
| 5,416,860 A | 5/1995 | Lee et al. |
| 5,463,316 A | 10/1995 | Shirai et al. |
| 5,479,094 A | 12/1995 | Esman et al. |
| 5,483,161 A | 1/1996 | Deeter et al. |
| 5,486,754 A | 1/1996 | Cruden et al. |
| 5,493,222 A * | 2/1996 | Shirai et al. ............. 324/244.1 |
| 5,512,193 A | 4/1996 | Shirai et al. |
| 5,535,046 A | 7/1996 | Shirai et al. |
| 5,565,131 A | 10/1996 | Shirai et al. |
| 5,635,830 A | 6/1997 | Itoh |
| 5,699,461 A | 12/1997 | Minemoto et al. |
| 5,719,497 A | 2/1998 | Vesser et al. |
| 5,780,845 A | 7/1998 | Koide et al. |
| 5,889,609 A | 3/1999 | Fukushima |
| 5,895,912 A | 4/1999 | Bosselmann et al. |
| 5,898,516 A | 4/1999 | Shirai et al. |
| 5,903,198 A | 5/1999 | Weiss |
| 5,925,474 A | 7/1999 | Shirai et al. |
| 5,933,000 A | 8/1999 | Bosselmann et al. |

\* cited by examiner

*Primary Examiner*—Edward Lefkowitz
*Assistant Examiner*—Subhash Zaveri
(74) *Attorney, Agent, or Firm*—Greenburg Traurig; Richard E. Kurtz, II

(57) ABSTRACT

Described are the design of a rare earth iron garnet sensor element, optical methods of interrogating the sensor element, methods of coupling the optical sensor element to a waveguide, and an optical and electrical processing system for monitoring the polarization rotation of a linearly polarized wavefront undergoing external modulation due to magnetic field or electrical current fluctuation. The sensor element uses the Faraday effect, an intrinsic property of certain rare-earth iron garnet materials, to rotate the polarization state of light in the presence of a magnetic field. The sensor element may be coated with a thin-film mirror to effectively double the optical path length, providing twice the sensitivity for a given field strength or temperature change. A semiconductor sensor system using a rare earth iron garnet sensor element is described.

30 Claims, 5 Drawing Sheets

METHODS AND APPARATUS FOR OPTICALLY MEASURING POLARIZATION ROTATION OF OPTICAL WAVEFRONTS USING RARE EARTH IRON GARNETS

This application claims the benefit of U.S. patent application Ser No. 60/105,126, filed Oct. 21, 1998, the entire disclosure of which is hereby incorporated herein by reference.

BACKGROUND OF THE INVENTION

1. Field of the Invention

The invention relates in general to sensors which use rare-earth iron garnets as sensor elements, and in particular to sensors which use such garnets to rotate linearly polarized light for measurement of magnetic fields, electrical current, or temperature fluctuations.

2. Related Art

The rapid technology expansion in the military and commercial industries has dramatically increased the need for small, highly robust methods of monitoring parameters such as magnetic fields, electrical current flow, and temperature. Fiber optic sensors capable of monitoring these parameters have been under research and development for the better part of 30 years and have recently seen a significant improvement in performance as new advances in materials and manufacturing are made. Unfortunately, the practical implementation aspects of many of the prior inventions leave much to be desired in terms of ease of use.

The need to monitor magnetic fields and electrical current is enormous. Power companies are concerned with power losses all the way from the generation point to the final destination—the consumer. Additionally, power companies bill consumers based upon consumption; unfortunately, they still use monitoring technology that predates most of modern memory. Loss of the capability to monitor current flow results in potentially large losses in revenue. Power electronic system manufacturers, those who are responsible for converting standard electrical mains to varying levels of AC and DC, are constantly faced with limitations in sensor and control technology in the implementation of their designs. Their goals of increased efficiency (lower heat), smaller designs for a given power density, and increases in switching frequency are pushing the limits of conventional current and magnetic sensing technology. Coupled with this industry is an older industry—motor controls. Personnel involved with motor controls are constantly seeking better methods of increasing output efficiency through optimization of run-time parameters—all of which are derived from magnetic and current sensors. Physical limitations in existing sensor capabilities are restricting large advances in hybrid-motor development, which has had a measurable impact on the development of automotive hybrid engines.

Optical sensors are poised to revolutionize the sensor industry through their intrinsic advantages. In many instances the bandwidth of optical sensors is limited only by signal processing constraints—not the sensor material as is the case with many conventional sensors. Optical sensors are often immune to electromagnetic interference (EMI) noise; hence, they do not require specialized shielding in high-noise environments. This results in a smaller transducer cable with significantly less weight added to the entire assembly, an added benefit for industrial and aerospace/aircraft applications. It also removes the need for localized signal conditioning equipment to be positioned close to the monitoring point, resulting in potential savings in overall systems cost. Because optical sensors are typically small devices as compared to their conventional sensor counterparts, they have the potential to fit into smaller areas or be integrated into existing designs with little modification. The dielectric nature of optical fiber gives it an intrinsic isolation in signal measurement in high-voltage or -current applications, which is a considerable benefit to the electrical power and power semiconductor industry. Additionally, optical sensors are inert, which allows their use in potentially explosive environments. Finally, optical sensors can be remotely positioned from the signal processing equipment, an advantage that has tremendous benefits for the aerospace, aircraft, and automotive industries.

Certain materials change the polarization state of incident light in the presence of a magnetic field. This property, known as the Faraday effect, is widely used in the fiber optic telecommunications field, specifically to prevent reflected light energy from coupling back into a light source and changing source parameters such as frequency or power output. In sensor systems that exploit the Faraday effect, a sensor assembly is placed into a magnetic field. By monitoring the rotation of the incident polarization state, a direct measurement of the magnetic field intensity can be inferred.

Optical fiber is one material that exhibits a small Faraday effect. Based upon this, many inventions have been disclosed which measure the amount of current flowing through a conductor. By wrapping multiple turns of optical fiber around the conductor and applying Ampere's Law (increasing the path length), the amount of current can be directly measured. Unfortunately, this sensor method is often impractical in many applications because it is not feasible to interrupt power by disconnecting the conductor, installing the fiber coil assembly, then reconnecting the conductor.

Certain crystalline materials, known as rare-earth iron garnets (REIGs), exhibit a much larger Faraday rotation per unit magnetic flux density than their fiber optic waveguide counterparts. These crystals are synthetic and typically (but not exclusively) have a general formula equation

$$R_{3-x}Bi_xFe_{5-x}A_yO_{12}$$

where R is from the family of elements comprising Y, La, Ce, Pt, Nd, Sm, Eu, Gd, Tb, Dy, Ho, Er, Tm, Yb, or Lu, A is from the family of elements comprising Ga, Sc, Al, or In, and $0.3<=x<=2.0$ and $0.0<=y<=1.0$. A number of methods exist to grow these materials and range from the flux method to the Czochralski method to liquid-phase epitaxial growth (LPE). The preferred method of growing the crystals is subjective and is somewhat dependent upon the operating wavelength of interest; no preferred method is implied or required for the present invention as sensor materials from both LPE and flux methods were implemented.

Sensor housings which use a REIG material have historically been designed in transmission mode—linearly polarized light enters one side of the crystal, travels the length of the crystal, and then exits the distant endface. Optics are required at the distant endface to either directly quantify the amount of rotation, or to couple the energy back into a waveguide so that it can be remotely optically processed. Although this configuration can work in many applications, axial alignment of the optical components during manufacturing renders these configurations difficult to mass-produce. This topology also introduces size constraints in the fiber optic embodiment of the invention—the separate lead-in and lead-out fiber requirement increases the overall size of the sensor probe due to increased bulk optics, often making the monitoring of magnetic flux in applications such as switched-reluctance systems very difficult.

U.S. Pat. No. 4,563,639 (1986) to Langeac discloses a temperature and/or electrical intensity measuring apparatus based upon the Faraday effect. The sensor is an optical fiber wound in the form of a solenoid and is connected to a polarized light source as well as a beamsplitter and photodiodes. Through selective twisting of fiber, problems due to birefringence in the lead-in and lead-out fibers are overcome.

U.S. Pat. No. 5,463,316 (1995) and U.S. Pat. No. 5,493,222 (1996) to Shirai et al. discloses a reflection type magneto-optic sensor head. The head assembly specifically uses an integrated polarizer, a Faraday rotator comprised of a (111) bismuth-substituted iron garnet single crystal film, and a reflecting film, all of unitary construction such that each are in contact with the other. Also disclosed is another embodiment of this basic concept using rectangular prisms. The light launch/recovery system uses a laser light source, an input collimating lens, half mirror, multimode polymer-clad optical fiber, an output collimating lens, and a single photodiode. No discussion with respect to signal processing is made.

U.S. Pat. No. 5,483,161 (1996) to Deeter et al. discloses a magnetic field sensor utilizing high-permeability magnetic flux concentrators with a high-permeability magneto-optic sensing element to increase measurement sensitivity. The sensor is used in transmission mode (separate transmit and receive fibers) and utilizes convex lenses to collimate the polarized wavefront.

OBJECTS AND SUMMARY OF THE INVENTION

It is therefore an object of the invention to provide an improved sensor for measuring polarization rotation of optical wavefronts.

It is a further object of the invention to provide a fiber optic reflectance-type system that does not require a separate optical path to recover the measurand.

In a preferred embodiment, the invention provides sensors that use rare-earth iron garnets as sensor elements to measure magnetic fields, electrical current, or temperature fluctuations. The invention may be provided in the form of a bulk-optical system preferably aligned in the order of a laser light source, a polarizer, a chopper, a first-surface mirror, an anti-reflection coating, a Faraday rotator material, a reflecting film, a polarization beam splitter, and two low-noise detectors. The invention may also be embodied in a fiber optic system preferably comprising a light source pigtailed to optical fiber, an opto isolator, a fiber optic coupler, optical fiber, a grin lens, an anti-reflection coating, a Faraday rotator material, a substrate, a reflecting film, a polarization beam splitter, and two low noise detectors. A further embodiment provides a semiconductor sensor system using a rare earth iron garnet sensor element.

BRIEF DESCRIPTION OF THE DRAWINGS

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

DETAILED DESCRIPTION

Figure 1:
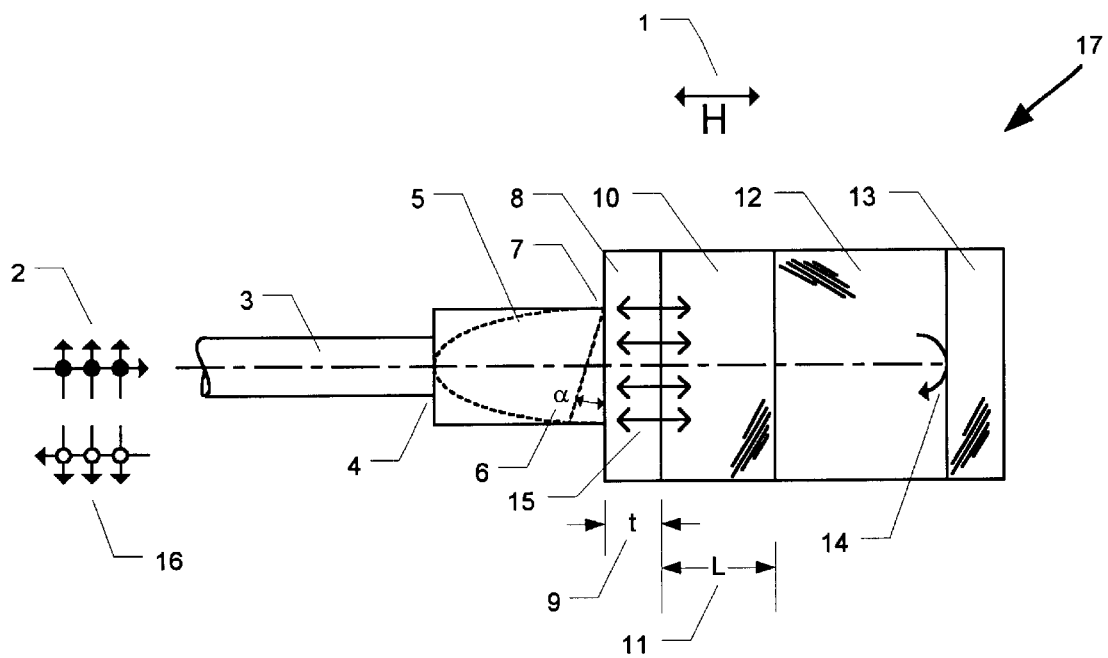
FIG. 1 shows the schematic of the fiber optic magneto-optic sensor assembly, which is based upon the Faraday effect of materials placed in a magnetic field.

FIG. 1 shows the schematic of a magneto-optic sensor assembly in accordance with a first, fiber optic, embodiment of the invention. The sensor of the invention uses the Faraday effect of materials placed in a magnetic field. The sensor 17 shown in FIG. 1 begins with linearly polarized light of known orientation 2 propagating down polarization maintaining single mode optical fiber (PM-SMOF) 3. The propagating wavefront encounters a quarter wavelength pitch graded index (GRIN) lens 5 after passing through the fiber/GRIN interface 4. This interface is comprised of an optical epoxy that is transparent to the primary propagating wavelength and the preferred refractive index of the epoxy is given by geometric mean of the interface refractive indices, or $$\sqrt{R_{fR_G}}$$

where $R_f$ is the refractive index of the fiber core and $R_G$ is the refractive index of the GRIN lens. Representative values of $R_f$, $R_G$ could be 1.45 and 1.61 respectively, at the wavelength of interest. After passing through the GRIN lens the optical wavefront is collimated 15. This wavefront encounters another epoxy interface whose preferred refractive index is given by $$\sqrt{R_{GR_{AR}}}$$

where $R_G$ is the refractive index of the GRIN lens and $R_{AR}$ is the refractive index of the antireflection (AR) coating 8, or, in the case where this coating is omitted, the refractive index of the REIG crystal 10. Again, representative values of $R_G$, $R_{AR}$, and $R_{REIG}$ ($R_{REIG}$ is the refractive index of the REIG crystal in a preferred direction) are 1.61, 1.31, and 2.1 respectively. The wavefront propagates through the REIG crystal, and in the presence of the magnetic field H 1 with some component parallel to the direction of wavefront propagation, will undergo a rotation θ (theta) dependent upon crystal parameters and the single direction optical path length L 11. If the REIG crystal 10 has been epitaxially grown on a transparent non-magnetic garnet substrate 12, such as $Gd_3Ga_5O_{12}$, (also known as GGG) then the wavefront will propagate through the GGG substrate and will reflect from the dielectric or metallic thin-film mirror 13, which could be comprised of aluminum.

After reflecting from the thin-film mirror 13 the wavefront traces the incident path. After traveling through the REIG crystal 10 the wavefront undergoes yet another rotation θ (theta) due to the non-reciprocity of the REIG crystal. The collimated wavefront is collected in GRIN lens 5 and is refocused onto the core of the fiber 3. This final wavefront 16, still linearly polarized, is offset from the incident polarization state by an amount 2θ (2*theta) due to the doubling of the optical path length produced by the thin film mirror 13.

Additional design constraints exist in sensor 17 as shown in FIG. 1. The mode field diameter of SMOF in the visible wavelength range is approximately 5.5 μm (10e−6m) or less. As wavelength increases so does the core size of the fiber, reaching 9 μm at 1300 nm and 11 μm at 1550 nm. This alone has a tremendous impact upon the amount of energy placed into the system as well as recovered, and use of a GRIN lens 5 increases the amount of power recovered nearly by 4 dB. Additionally, as mode field size decreases, the individual probing of magnetic domains occurs in a system not using a GRIN lens, resulting in localized "hotspots/dead spots" in rotational values. The use of a GRIN lens 5 to couple energy 2 from the SMOF fiber 3 into the REIG crystal 10 results in the optical wavefront being spread over a much larger surface area of the actual sensor material 10, hence giving rise to an "average domain effect". The result is enhanced stability and repeatability in measurements. Although the GRIN can be omitted, there is a significant penalty in the amount of returned power to the detection system which has negative implications on signal to noise ratio.

As previously stated, the AR coating 8 may or may not be provided. If implemented, the thickness t 9 of the AR coating is given by the general formula $t = N * \lambda/4$, where $N \in \{1,3,5, \ldots\}$ and λ is the primary wavelength of the propagating wavefront. Factors governing whether or not the AR coating 8 is implemented are the value of λ selected and properties characterizing the REIG crystal which govern overall system performance.

Shown on sensor 17 in FIG. 1 is an angle α (alpha) 6 that is measured between the endface of the GRIN lens and the incident interface of either the AR coating 8 or the REIG crystal 10. Experimentally it has been shown that this angle polished onto the GRIN such that $0 <= \alpha <= 11$ degrees can result in significant decrease in reflected optical energy from the AR coating 8 or the REIG crystal 10. This decrease in continuous optical energy manifests itself as a decrease in the background DC, resulting in a significant improvement of system sensitivity. The value of α (alpha) is determined by the overall desired SNR of the system and mode of operation (whether the system will be used in AC and/or DC monitoring applications).

Shown on sensor 17 in FIG. 1 is a non-magnetic garnet substrate 12, such as GGG. The presence of this material is dependent upon the choice of REIG material 10 and the method used to fabricate the REIG crystal. For example, REIGs grown through liquid phase epitaxial (LPE) growth methods use the GGG as the seed; hence GGG will be included in the sensor configuration. Contrasting, other REIGs grown using a flux growth technique require no GGG substrate; hence, a pure REIG crystal can be implemented in the sensor configuration. Examples of this are Bi-substituted yttrium iron garnet (Bi-YIG) crystals grown in a LPE furnace and pure YIG crystals produced using flux techniques. Both are well documented in the literature and samples of each have been implemented. Other methods available to grow REIG materials with magneto-optical properties are also metal-oxide chemical vapor deposition (MOCVD) and the use of sol-gel processes. No preferred method is implied with respect to this invention.

Figure 2:
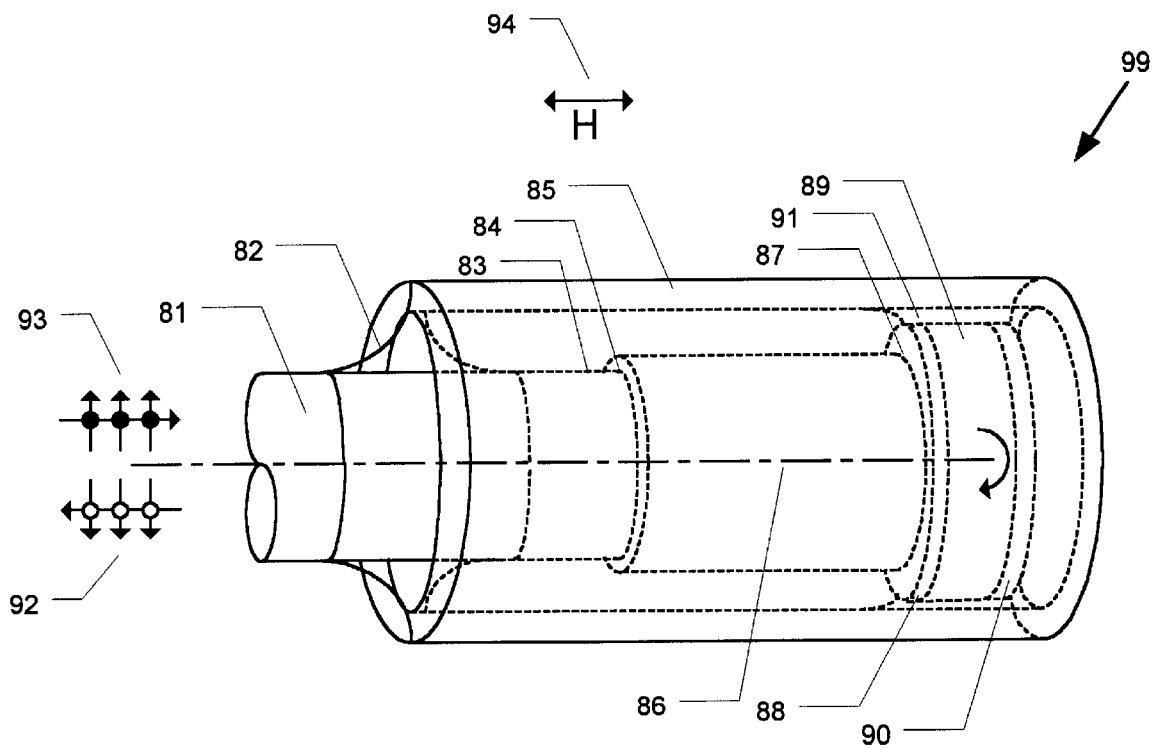
FIG. 2 shows a schematic of the fiber optic magneto-optic sensor assembly used for low-profile measurements of current or magnetic flux density.

The sensor 99 shown in FIG. 2 shows the basic embodiment of sensor 17 of FIG. 1 enclosed within a silica hollow-core tube 85 such that as manufactured by Polymicro Technologies. Operation starts with linearly polarized light of known orientation 93 propagating down PM-SMOF 81. The propagating wavefront encounters a quarter wavelength pitch GRIN lens 86 after passing through the fiber/GRIN interface 84. This interface is comprised of an optical epoxy that is transparent to the primary propagating wavelength and the preferred refractive index of the epoxy is given by geometric mean of the interface refractive indices, or $$\sqrt{R_f R_G}$$

where $R_f$ is the refractive index of the fiber core and $R_G$ is the refractive index of the GRIN lens. Representative values of $R_f$, $R_G$ could be 1.45 and 1.61 respectively, at the wavelength of interest. After passing through the GRIN lens the optical wavefront is collimated. This wavefront encounters another epoxy interface whose preferred refractive index is given by $$\sqrt{R_G R_{AR}}$$

where $R_G$ is the refractive index of the GRIN lens and $R_{AR}$ is the refractive index of the AR coating 88, or, in the case where this coating is omitted, the refractive index of the REIG crystal 89. Again, representative values of $R_G$, $R_{AR}$, and $R_{REIG}$ ($R_{REIG}$ is the refractive index of the REIG crystal in a preferred direction) are 1.61, 1.31, and 2.1 respectively. The wavefront propagates through the REIG crystal, and in the presence of the magnetic field H 94 with some component parallel to the direction of wavefront propagation, will undergo a rotation θ (theta) dependent upon crystal parameters and the single direction optical path length. After the wavefront has propagated through the REIG crystal 89 it will reflect from the dielectric or metallic thin-film mirror 90, which could be comprised of aluminum.

After reflecting from the thin-film mirror 90 the wavefront traces the incident path. After traveling through the REIG crystal 89 the wavefront undergoes yet another rotation θ (theta) due to the non-reciprocity of the REIG crystal. The collimated wavefront is collected in GRIN lens 86 and is refocused onto the core of the fiber 81. This final wavefront 92, still linearly polarized, is offset from the incident polarization state 93 by an amount 2θ (2* theta) due to the doubling of the optical path length produced by the thin film mirror 90.

As previously stated the AR coating 88 may or may not exist. If implemented, the thickness t of the AR coating is given by the general formula $t = N*\lambda/4$, where $N \in \{1,3,5, \ldots\}$ and λ is the primary wavelength of the propagating wavefront. Factors governing whether or not the AR coating 88 is implemented are the value of λ selected and properties characterizing the REIG crystal which govern overall system performance.

As referred in FIG. 2 the size of the GRIN lens 86 and the REIG sensor element 88,89,90 are shown such that the endface of the GRIN lens 89 is smaller than that of the REIG element 88,89,90. This is not a constraint of the sensor design 99; optimally the GRIN lens would be the same diameter as the REIG sensor element 88,89,90 so that maximal volume of the element is used as the sensing media.

In FIG. 2 the entire assembly, which physically consists of components (in optical incidence order) PM-SMOF 81, GRIN lens 86, and REIG sensor element 88,89,90, can be bonded into a cylindrical housing, either metallic or non-metallic, to provide stability for the sensor head and to provide a degree of environmental protection. One method to secure the sensor assembly to the housing is through epoxy fillets 82 and 89, which may or may not encircle the fiber 81 and REIG sensor element 88,89,90 360 degrees. If a metallic housing is utilized then care must be given to the permeability of the material, for this could redirect flux lines around the sensor assembly rather than through the REIG crystal element. A thin-walled silica (SiO$_2$) hollow-core tube 85, possibly 1 mm in diameter, is sufficient to demonstrate this concept and remove any chance that magnetic lines of flux are being redirected. Potentially, redesign of the concept of Deeter et al. (U.S. Pat. No. 5,483,161) in place of hollow-core housing 85 could allow for greater sensitivity of the sensor head. This potential design modification does not alter the basic operation of the sensor 99.

Figure 3:
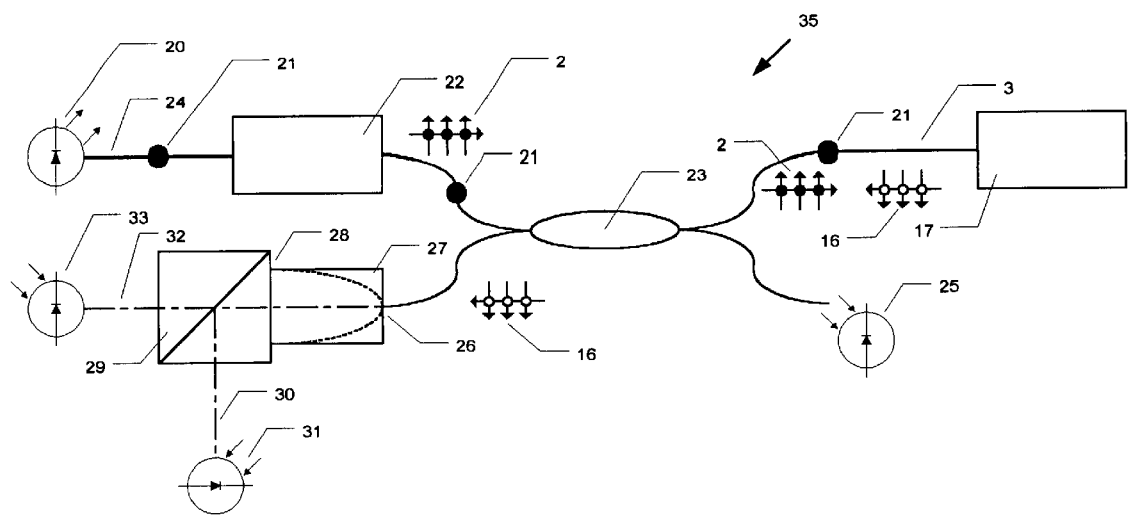
FIG. 3 shows the complete fiber optic system capable of processing the optical signal and applying it to the signal processing electronics.

FIG. 3 presents the complete fiber optic system 35 to support magnetic field, electrical current, or temperature measurements. A LED or laser source 20 pigtailed to single mode optical fiber (SMOF) 24 is fusion spliced 21 to SMOF from the input side of a Faraday isolator 22. Depending upon the pigtail configuration, the LED/laser 20 may or may not use a focusing element. The output of the Faraday isolator 22 is a linearly polarized wavefront 2 of known polarization orientation traveling in either SMOF or PM-SMOF depending upon isolator manufacturer. The output fiber from the Faraday isolator 22 is fusion spliced 21 to the input arm of a polarization maintaining single mode optical 2×2 coupler (PM-SMOC) 23 such that the fast and slow axis' of the PM-SMOC are oriented at the preferred angle of 45 degrees with respect to the orientation of the wavefront 2. The polarized wavefront travels through the PM-SMOC 23 and is coupled equally into each of the output arms. One of the output arms of the PM-SMOC 23 is fusion spliced 21 to standard PM-SMOF 3 and is coupled into the sensor assembly 17 as previously described. The other output arm of the PM-SMOC 23 is coupled to a photodiode 25, which provides drive information to the laser/LED driver circuitry. Note that photodiode 25 can be omitted and not change the overall system operation.

The output of the sensor assembly 17 is a rotated polarization state of light 16 proportional to the intensity of the magnetic field in parallel with the incident beam. This wavefront travels back through the PM-SMOC 23 (from right to left as shown in FIG. 3) and splits into two paths: one that travels back towards the source 20 and the other towards the remaining analyzer 29 and photodiodes 31,33. With respect to the former path this wavefront is phase shifted 45 degrees plus an amount proportional to the strength of the magnetic field measured by the sensor 17. After propagating through the isolator 22 the wavefront will undergo an additional 45 degrees rotation, causing the overall rotation to be 90 degrees ± the sensor rotation 2θ (theta). This optical energy will couple back into the laser/LED source 20, but relative strength of this signal is approximately equivalent to the forward power multiplied by the sine of the rotation 2θ less 9 dB. In other words, the backward coupled energy into the source can be described by $$P_r \approx P_i * \sin(2\theta) - 9 \text{ dB}$$

where $P_r$ is the amount of reflected power incident upon the source 20, $P_i$ is the amount of power originally output by the source and coupled into the launch fiber, and θ (theta) is the single-path rotation due to an external magnetic field. This value, although significant enough to effect changes in the quantum efficiency of the source cavity, can be compensated and somewhat minimized in electronics using a power monitoring photodiode 25 in addition to an intrinsic back-facet monitor photodiode 122 (FIG. 4).

With respect to the signal traveling in the lower left arm of FIG. 3, the wavefront 16, now reduced by at least 3 dB due to the properties of the PM-SMOC 23, is coupled from the coupler arm to a GRIN lens 27 through interface 26. As in the sensor arm, the two are coupled via an optical epoxy with a refractive index that is the geometric mean between the refractive index of the core of the PM-SMOC arm and the refractive index of the GRIN lens 27. The output of the GRIN 27 is a collimated wavefront that is now incident on an analyzer 29, in this case an orthogonal polarization beamsplitter (PBS) with a 500:1 extinction ratio. In the preferred embodiment the GRIN is attached to the PBS 29 with an optical epoxy with a refractive index that is the geometric mean between the refractive index of the GRIN 27 and the PBS 29. The PBS is positioned such that it provides two outputs, 30 and 32, to two low-noise photodiodes 31 and 33 respectively. Each output is orthogonal to the other, that is, the relative intensity of each output is independent of the other such that the two intensities describe the rotational state of the polarization vector.

Figure 4:
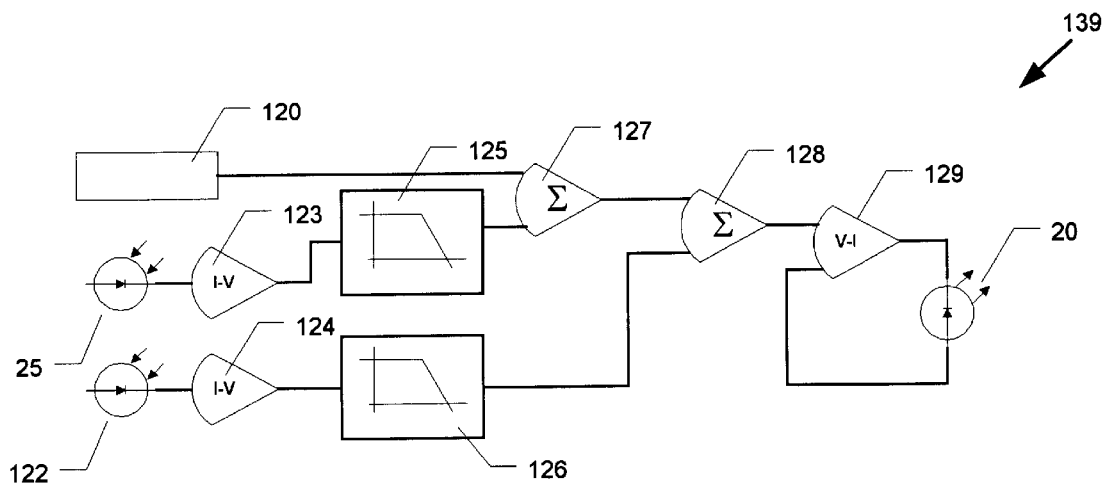
FIG. 4 shows the functional block diagram of the driver section for the LED or laser assembly.

Shown in FIG. 4 is a block diagram of the major functions of the LED/laser drive electronics 139. This configuration helps to reduce noise, which modulates the LED/laser and consequently, is detected in the signal processing function 119 of FIG. 7. Operation begins shortly after turn-on through the precision, low noise reference voltage source 120. This source is one input to an operational amplifier (opamp) subsystem 127. The other input is produced from the opto-electrical chain consisting of forward power-monitoring photodiode 25, a low-noise transimpedance (I-V) amplifier subsystem 123, and an $8^{th}$-order Butterworth low-pass filter subsystem 125. At turn-on the input from this second chain is nearly zero, hence the error between the inputs of 127 is large. This large voltage command is sent to one input of another opamp subsystem 128. As in the previous opto-electronic conversion chain the second input to opanp 128 is comprised of a back-fact monitor photodiode 122, a low-noise I-V amplifier subsystem 124, and an 8Corder Butterworth low-pass filter subsystem 126. At turn-on the input from this second chain is nearly zero, hence the error between the inputs of 128 is large. This large error command is sent to a low-noise transconductance (V-I) amplifier subsystem 129 which converts the command voltage from the previous stage 128 into a current command. As optical power within the system 35 (FIG. 3) rises the two I-V conversion chains become non-zero, reducing their respective error commands to the inputs of opamp subsystems 127, 128, and hence to V-I converter 129. The current command then biases the LED/laser 20 and the system eventually stabilizes to a predetermined optical output level.

The second opto-electronic conversion chain in FIG. 4 can be optional depending upon whether or not the LED/laser 20 has a back-facet photodiode monitor available. In the event that the there is no provision for this opamp 128 can be bypassed and tied directly to the V-I amplifier 129. The impact of doing this is a potential noise increase in the system.

Low-pass filters 125 and 126 can be set to provide signal response bandwidths to approximately 220 kHz, but typically are set lower to minimize noise within the system. Note that these filters have minimal impact upon the detection system bandwidth; they are provided solely to remove random intensity noise and electronic noise in the power generation system 139. These filters 125,126 control the loop response rate to sudden increases or decreases in noise power within the generation system 139 and are tailored depending upon the specific characteristics of the LED/laser source 20.

Figure 5:
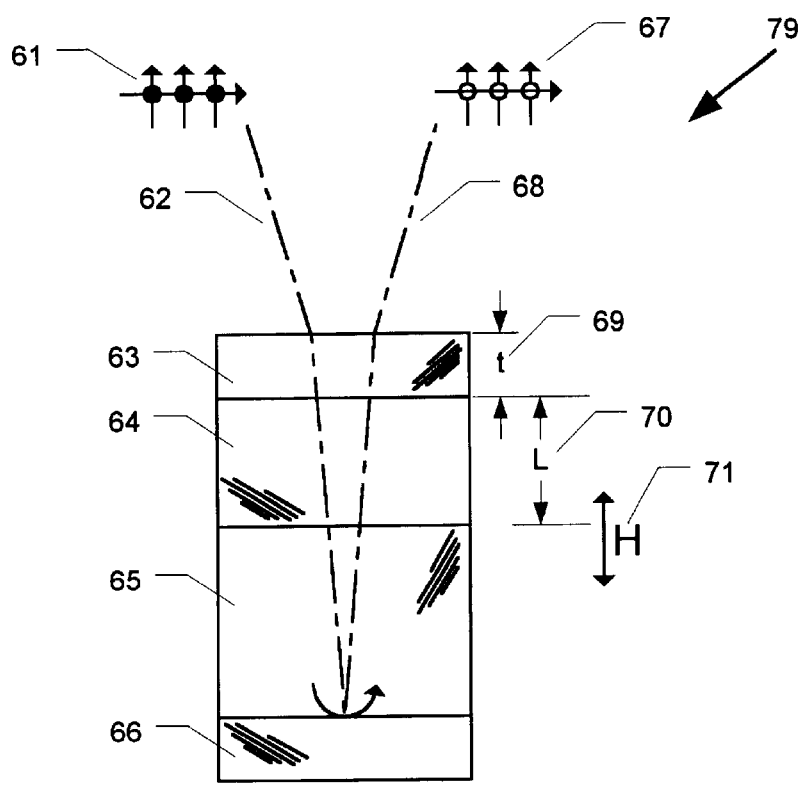
FIG. 5 shows the operation of the bulk optic sensor element.

Shown in FIG. 5 is the sensor element 79, which is the foundation of the sensing mechanism. The sensing element 79 is comprised of at least two layers, and potentially four, depending upon the intended application of the element. Linearly polarized light of known orientation 61 is incident in free space 62 at a nearly normal angle to the endface of element 79. This wavefront penetrates an AR layer 63 of thickness t 69, or, in the case where this coating is omitted, the REIG crystal 64. As the wavefront propagates through the REIG crystal and in the presence of the magnetic field H 71 with some component parallel to the direction of the wavefront propagation, will undergo a rotation θ (theta) dependent upon crystal parameters and the single direction optical path length L 70. If the REIG crystal 64 has been epitaxially grown on a transparent non-magnetic garnet substrate 65, such as GGG, then the wavefront will propagate through the GGG substrate and will reflect from the dielectric or metallic thin-film mirror 66, which could be comprised of aluminum.

After reflecting from the thin-film mirror 66 the wavefront nearly traces a normal path, but slightly off axis due to the misalignment of the incident wavefront 61. After traveling through the REIG crystal 64, the wavefront undergoes yet another rotation θ (theta) due to the non-reciprocity of the REIG crystal. This final wavefront 67, still linearly polarized, is offset from the incident polarization state by an amount 2θ (2* theta) due to the doubling of the optical path length produced by the thin film mirror 66.

Figure 6:
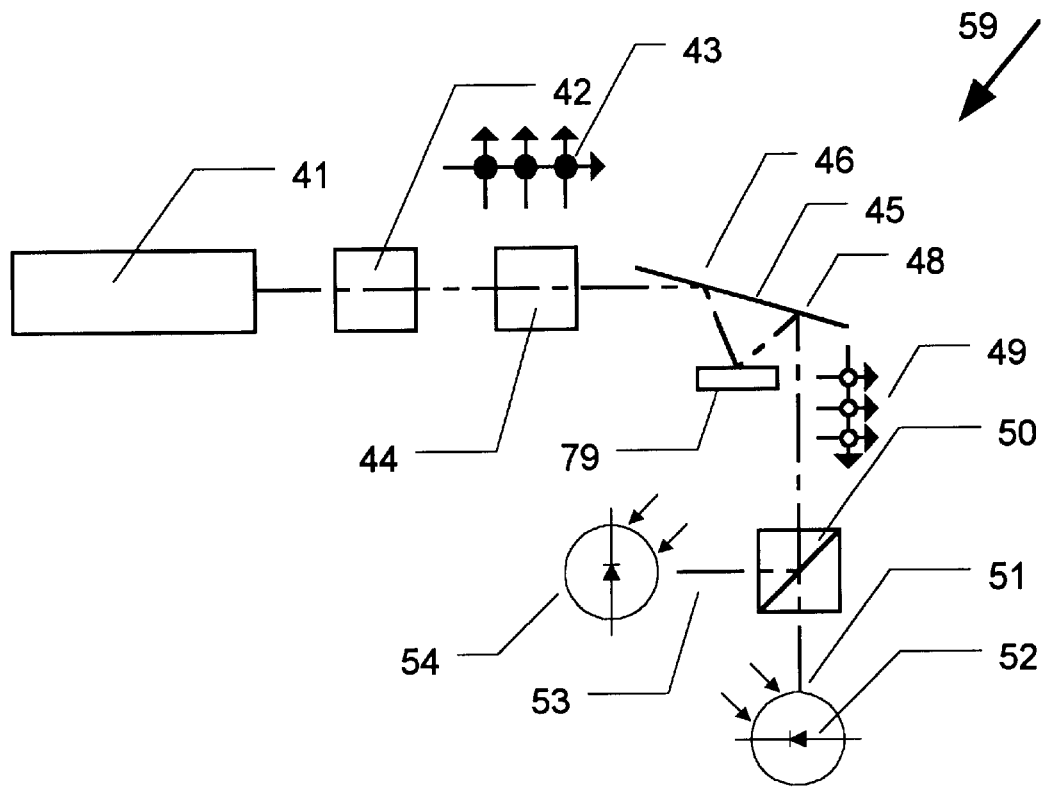
FIG. 6 shows the complete optical path of the bulk-optical system capable of characterizing the sensor element in terms of sensitivity and frequency response.

The AR coating 63 may or may not exist. If implemented, the thickness t 69 of the AR coating is given by the general formula t=N* λ/4, where N∈{1,3,5, . . . } and λ is the primary wavelength of the propagating wavefront. Factors governing whether or not the AR coating 69 is implemented are the value of λ selected and properties characterizing the REIG crystal which govern overall system performance. FIG. 6 presents the complete bulk-optical system 59 to support magnetic field, electrical current, or temperature measurement. A helium-neon (HeNe) laser source launches highly coherent light through polarizer 42, which assigns a known polarization state 43 to the optical wavefront. This wavefront travels through an optical chopper 44, which is used to modulate the laser source 41 to enable low-level signal measurements. The modulated beam strikes first-surface mirror 45 at a location 46 such that the normal to the mirror 45 and the normal to the sensor element 79 are not parallel. This directs the optical wavefront off normal axis to the sensor element 79. After propagating through the sensor element as previously described the wavefront exits the sensor element 79 and strikes the mirror 45 at a location 48. This directs the modulated optical wavefront 49 through free space towards a PBS 50 aligned in the path of the wavefront. The PBS 50 splits the wavefront into two beams of independent intensity; the intensity is a function of the polarization angle of the wavefront 49. Two low-noise photodetectors 52,54 are positioned such that the optical outputs 51 and 53 from the PBS 50 are incident on their active surfaces.

Figure 7:
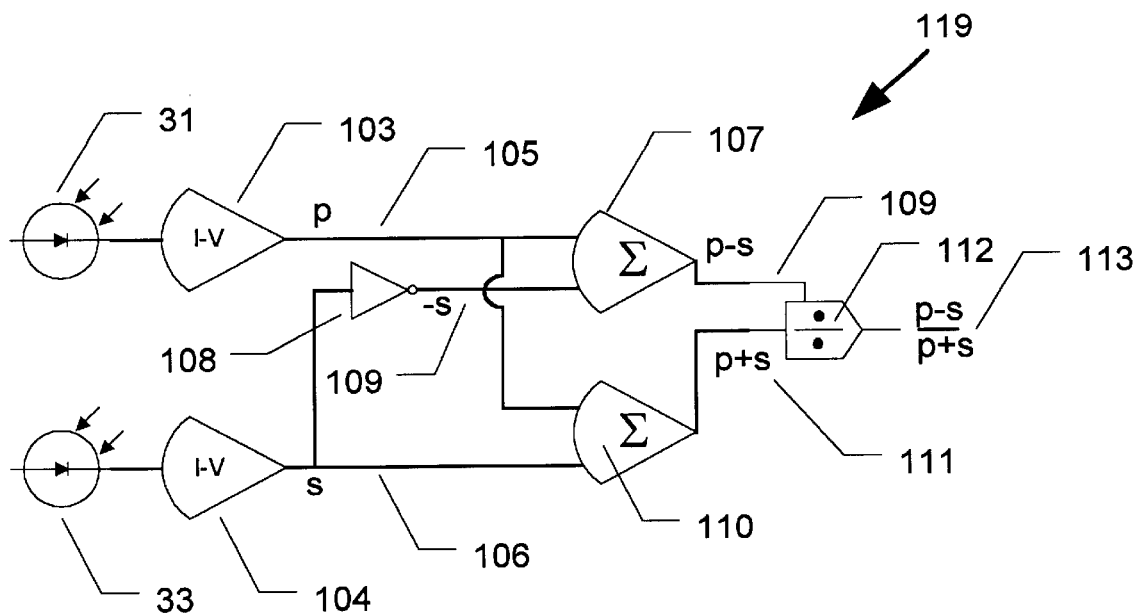
FIG. 7 shows the basic signal processing electronics to recover a signal proportional to the polarization state of rotation.

Shown in FIG. 7 is the analog electronics implemented to quantify the rotational value of the polarization state from some initial starting value. The electronic opto-electronic system is a preliminary part of the overall signal processing system, and represents the foundation of a much larger algorithm that is required to use either of the systems in a continuous, long-term monitoring application.

Operation of the opto-electronic front end 119 begins with two independent intensities arriving at photodiodes 31 and 33. These signals are the decomposed orthogonal components of the polarization vector such that a rough estimation of the polarization state can be determined by $$\beta = \text{Arc } \tan(p/s)$$

where β is the value of rotation, p is one of the intensity components, and s is the other intensity component. The output of each photodiode is processed by a low-noise transimpedance (I-V) operational amplifier subsystem 103 and 105 to provide a voltage proportional to the current input. For the sake of this discussion, the output of I-V converter 103 is termed the p component and the output of I-V converter 105 the s component 106. These are purely arbitrary assignments.

Although the p/s relationship in the argument above is valid, concerns with common-mode intensity fluctuations of the LED/laser source 20 of FIG. 3, in addition to the limited dynamic range of the argument (if s goes to 0 then loss of directionality occurs) forces a more robust algorithm. Although a considerable number of potential methods exist to measure the polarization state rotation, a modification of the method of Mansuripur et al. (Applied Optics, 29 (9), Mar. 20, 1990) was selected due to its ease of implementation. Correspondingly, the method selected uses a difference/sum relationship that is given by $$\frac{p-s}{p+s}$$

where p and s were previously defined.

To provide this value, the remaining part of FIG. 7 details the major functional sections. Signal s 106 is inverted by unity gain inverting amplifier 108 and is applied to summation amplifier 107. The other input to this amplifier 107 is a p input; hence, the output produced is p−s 109. Signal s is also applied to summation amplifier 110 whose other input is signal p; the output of this amplifier 110 is p+s 111. These signal outputs 109, 111 are applied to a logarithmic division amplifier 112 to produce the required output 113.

The output of the front end of the signal processing system 119 represents a direct measurement of the rotational value of the polarization state, which could be a function of magnetic flux density, current, or temperature. This value comprises a steady-state DC component, which can be a function of temperature, the steady-state magnetic field, or backscatter within the system, and an AC component, which contains the dynamic information present within the measured signal. Depending upon application, the DC component can be discarded, allowing only for dynamic signals to be monitored, or can be included, to show both AC and DC values. Typically, these output signals are sent to additional signal processing components such as analog-to-digital converters, microprocessors, and/or digital-to-analog converters. Configuration is completely application specific.

Figure 8:
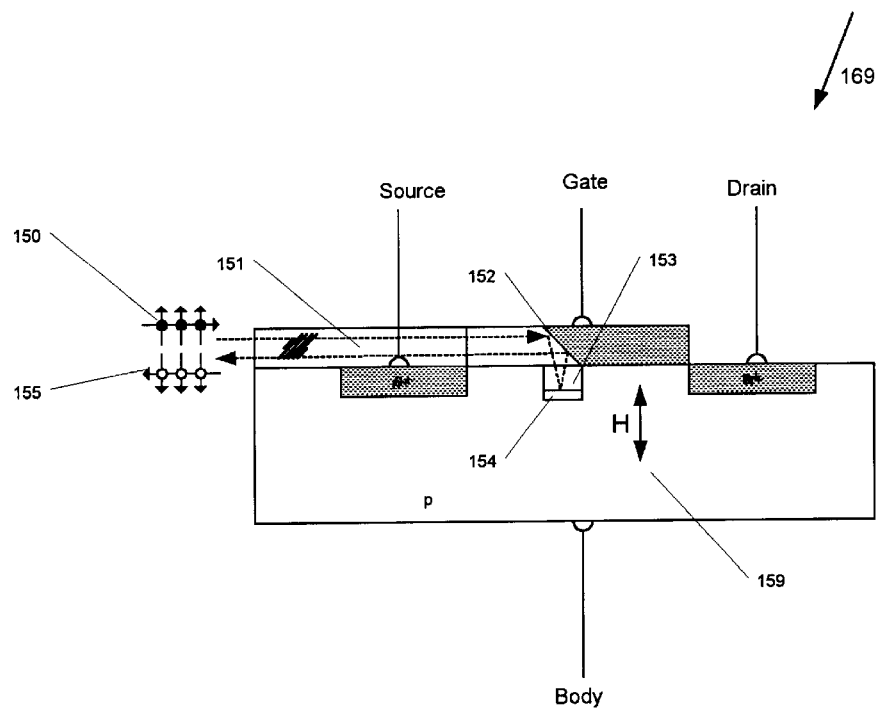
FIG. 8 shows a concept of the sensor element integrated with a simple semiconductor to provide on-chip monitoring of current, using a single waveguide.

FIG. 8 shows an embodiment of the invention applied to a power electronics device. Shown is a n-channel enhancement mode MOSFET power electronics device, but any power electronics device could be used with this technology. Linearly polarized light of known orientation 150 propagating through a planar waveguide 151 and strikes an angled interface 152, where it is reflected toward through a REIG crystal 153 to reflecting dielectric or metalized boundary 154. As in the case of 17 (FIG. 1) the light undergoes a rotation of θ (theta) as it travels through the crystal 153 in the presence of a magnetic field 159 with some portion of the field vector 159 parallel to the direction of propagation. This rotated wavefront, having reflected off thin film 154, traces the incident path through the REIG crystal 153 where it again experiences another rotation θ (theta) in the presence of said magnetic field 159. This wavefront, now being rotated a total of 2θ (2* theta), strikes the boundary 152 of the waveguide and is reflected towards the source point on the substrate, leaving the waveguide 151 as a rotated wavefront 155.

The technology presented in the device 169 represents one configuration when the magnetic field 159 is oriented perpendicular to the plane of the substrate. In the event that the field is horizontal to the plane of the substrate the waveguide 151 could be fabricated such that the angled interface 152 is omitted and the sensor assembly 153,154 could be placed at the end of the waveguide in place of 152. The orientations presented in 169 are done so to show one particular embodiment in one particular application; as the geometry of each semiconductor is different and the waveguide/sensor structure will change accordingly. No restrictions are implied to the application of this sensor/waveguide structure for use in semiconductor field monitoring.

Figure 9:
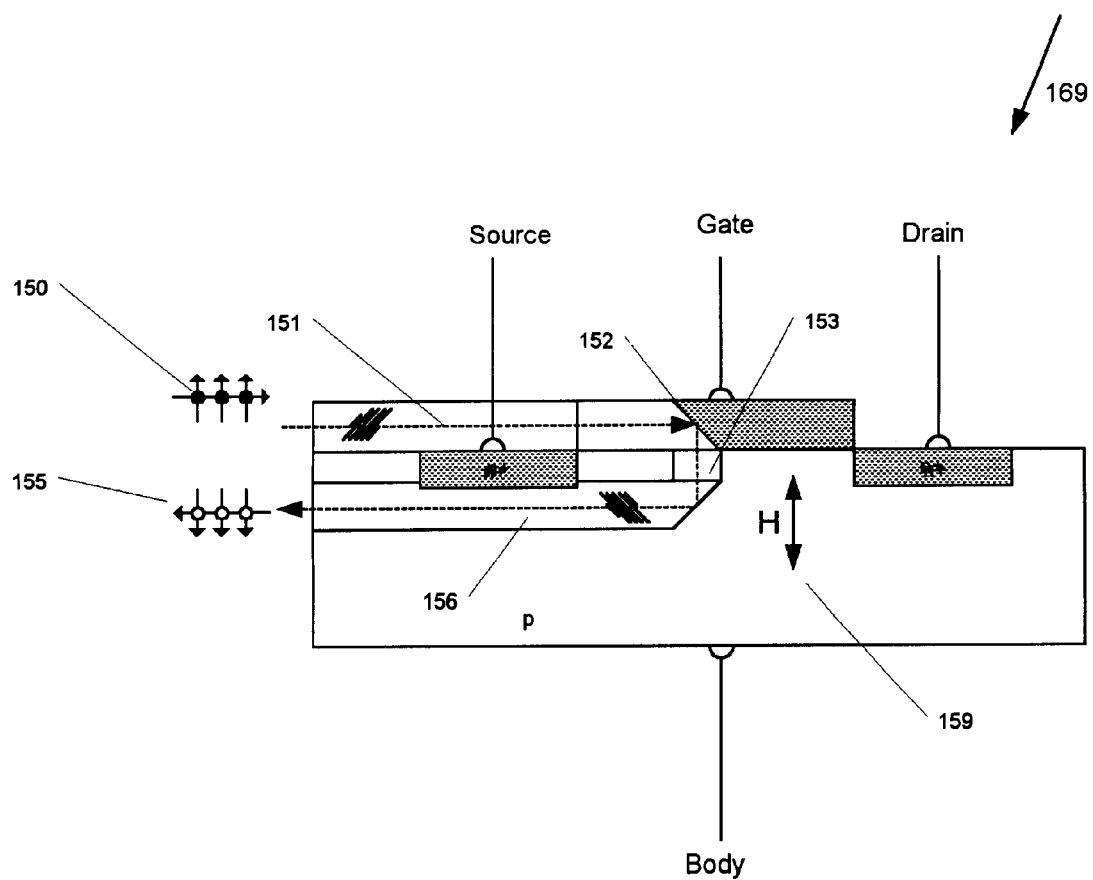
FIG. 9 shows a concept of the sensor element integrated with a simple semiconductor to provide on-chip monitoring of current, using two waveguide assemblies.

The embodiment of device 169 is not exclusive. The same concept presented in FIG. 8 is presented as FIG. 9 but omits reflective substrate 154 (FIG. 8) while adding additional waveguide 156. Additional waveguide 156 serves as the continuation of the transmission path and carries the modulated optical wavefront of known polarization state 155 to the edge of the semiconductor substrate for subsequent detection and processing.

While the invention has been particularly shown and described with reference to a preferred embodiment thereof, it will be understood by those skilled in the art that various changes in form and details may be made therein without departing from the spirit and scope of the invention.

The embodiments of the invention in which an exclusive property or privilege is claimed are defined as follows:

1. A magneto-optic sensor element comprising:
    a crystal substrate;
    a thin-film reflective surface on a first face of said crystal substrate;
    a rare-earth iron garnet thin-film on a second face of said crystal substrate, said second face opposing said first face; and,
    an anti-reflection coating on said rare-earth iron garnet substrate the anti-reflection coating has a thickness t which is within the range: $0<=t<N*$.lambda. /4 where lamda represents the primary wavelength of an incident polarized wavefront and N is an odd- integer such that $1<=N<=\infty$.

2. The magneto-optic sensor element according to claim 1, wherein said thin film reflective surface comprises a dielectric mirror deposited on said crystal substrate.

3. The magneto-optic sensor element according to claim 1, wherein said thin film reflective surface comprises a metallic mirror deposited on said crystal substrate.

4. The magneto-optic sensor element according to claim 1, wherein said crystal substrate is optically transparent with respect to the wavelength of an incident polarized wavefront.

5. The magneto-optic sensor element according to claim 1, wherein said rare-earth iron garnet thin-film is deposited on said second face of said crystal substrate.

6. The magneto-optic sensor element according to claim 1, wherein said rare-earth iron garnet thin-film is grown on said second face of said crystal substrate.

7. The magneto-optic sensor element according to claim 1, wherein said anti-reflection coating is deposited on said rare earth iron garnet substrate.

8. The magneto-optic sensor element of claim 1, wherein said thin-film reflective surface doubles the total single-direction optical path length through said rare-earth iron garnet thin film and supporting crystal substrate.

9. A magneto-optic sensor element comprising:
    a crystal substrate which is optically transparent with respect to the wavelength of an incident polarized wavefront from a sensor light source, said crystal substrate further comprising a rare-earth iron garnet crystal;
    a dielectric thin-film mirror deposited one side of said rare-earth iron garnet crystal; and,
    an anti-reflection coating of thickness $0<=t<=N*$.lambda./4, where lambda is the primary wavelength of an incident polarized wavefront and N is an odd-integer multiple such that $1<N<=\infty$, deposited on the opposite end of the rare-earth iron garnet substrate.

10. The magneto-optic sensor element of claim 9, wherein said thin-film reflective surface doubles the total single-direction optical path length through said rare-earth iron garnet thin film and supporting crystal substrate.

11. The magneto-optic sensor element according to claim 1, further comprising:
    a graded-index lens for coupling optical energy into said crystal substrate.

12. The magneto-optic sensor element according to claim 11, wherein said graded-index lens is optically tuned to the quarter wavelength of an incident polarized wavefront from a sensor light source.

13. The magneto-optic sensor of claim 12, wherein said graded-index lens comprises a quarter-pitch lens at the primary wavelength.

14. The magneto-optic sensor of claim 11, wherein said graded-index lens is in the shape of a right-angled cylinder and is bonded to an anti-reflection side of said crystal substrate via an optically transparent epoxy.

15. The magneto-optic sensor element of claim 11, wherein said graded-index lens is polished on at least one end to a facet angle of $0<=$alpha. $<=11$ degrees, measured with respect to the rotational symmetry axis of the cylinder.

16. The magneto-optic sensor of claim 11, arranged such that an incident plane polarized light beam propagating through said sensor element travels along the axis of said graded-index lens, through said crystal substrate, and strikes said thin-film mirror at essentially normal incidence.

17. A magneto-optic sensor probe comprising:
    a crystal substrate;
    a thin-film reflective surface on a first face of said crystal substrate;
    a rare-earth iron garnet thin-film on a second face of said crystal substrate, said second face opposing said first face;
    a graded-index lens for coupling optical energy into said crystal substrate; and,
    a optical fiber coupled with said graded-index lens.

18. The magneto-optic sensor probe of claim 17, wherein said optical fiber comprises a polarization-maintaining single mode optical fiber.

19. The magneto-optic sensor probe of claim 18, further comprising an anti-reflection coating on said rare-earth iron garnet substrate.

20. The magneto-optic sensor probe of claim 18 wherein said polarization maintaining single mode optical fiber is bonded to said graded-index lens using optical epoxy.

21. A fiber optic sensor system, comprising:

a light source for emitting a light beam;

a polarizing means for polarizing said light beam;

fiber optic coupler;

crystal substrate having a rare-earth iron garnet thin-film on a face thereof;

graded index lens assembly optically coupled to said fiber optic coupler;

beamsplitter optically coupled to said graded index lens assembly; and, detector means for converting optical energy into electrical energy.

22. The fiber optic sensor system according to claim 21, wherein said polarizing means comprises a Faraday isolator.

23. The fiber optic sensor system of claim 22 wherein:

said light source is coupled to said optical fiber via a lensing system such that the output of said light source is effectively coupled into a core of said optical fiber;

said light source outputs an arbitrary state of polarization;

said light source is fusion spliced to an input of said Faraday isolator;

said Faraday isolator polarizes and rotates said arbitrary state of polarization at said isolator input to a known state of polarization;

said fiber optic coupler comprises a 2×2 polarization-maintaining single mode coupler which is arranged such that the power ratio between output arms of said coupler is 1:1 and such that the known state of polarization produced by said Faraday isolator is maintained in each output arm;

one output arm of said fiber optic coupler is terminated into a forward power monitoring photodiode;

another output arm of said fiber optic coupler is fusion spliced to said optical fiber, said optical fiber being optically coupled to said crystal substrate;

the remaining arm of said fiber optic coupler is coupled to said graded index lens;

the output of the said beamsplitter having two independent optical intensities;

said signal recovery photodiodes being positioned such that the output from the said beamsplitter is incident upon their active regions.

24. The fiber optic sensor system according to claim 21, wherein said fiber optic coupler comprises a 2×2 fiber optic coupler.

25. The fiber optic sensor system according to claim 21, wherein said detector means comprises two signal recovery photodiodes.

26. The fiber optic sensor system according to claim 21, wherein said light source comprises a laser light source.

27. The fiber optic sensor system according to claim 21, wherein said light source comprises an LED light source.

28. The fiber optic sensor system according to claim 21, further comprising:

a forward power monitoring photodiode into which an output arm of said fiber optic coupler is terminated.

29. The sensor system of claim 21 wherein said beamsplitter is a polarization beam splitter (PBS) providing at least a 500:1 extinction ratio between its two output intensities.

30. The sensor system of claim 28, wherein said forward monitoring power diode provides additional compensation and noise reduction in the drive electronics of said light source.

* * * * *

UNITED STATES PATENT AND TRADEMARK OFFICE
CERTIFICATE OF CORRECTION

| | | |
|---|---|---|
| PATENT NO. | : 6,534,977 B1 | Page 1 of 1 |
| APPLICATION NO. | : 09/421399 | |
| DATED | : March 18, 2003 | |
| INVENTOR(S) | : Paul Duncan, Carvel E. Holton and Richard O. Claus | |

It is certified that error appears in the above-identified patent and that said Letters Patent is hereby corrected as shown below:

Col. 1, line 5, insert:

--This invention was made with Government support under No. DE-FG02-99ER86100 awarded by the Department of Energy. The Government has certain rights in this invention.--

Signed and Sealed this

Twenty-first Day of June, 2011

David J. Kappos
*Director of the United States Patent and Trademark Office*